United States Patent [19]

Kim

[11] Patent Number: 5,761,132
[45] Date of Patent: Jun. 2, 1998

[54] INTEGRATED CIRCUIT MEMORY DEVICES WITH LATCH-FREE PAGE BUFFERS THEREIN FOR PREVENTING READ FAILURES

[75] Inventor: Kyeong-Rae Kim, Kyungki-do, Rep. of Korea

[73] Assignee: Samsung Electronic Co., Ltd., Suwon, Rep. of Korea

[21] Appl. No.: 725,641

[22] Filed: Oct. 15, 1996

[30] Foreign Application Priority Data

Oct. 17, 1995 [KR] Rep. of Korea .................. 1995-35826

[51] Int. Cl.$^6$ .................................................. G11C 8/00
[52] U.S. Cl. .................... 365/189.05; 365/238.5
[58] Field of Search .................. 365/189.05, 238.5, 365/185.12, 233

[56] References Cited

U.S. PATENT DOCUMENTS

| | | | |
|---|---|---|---|
| 5,109,361 | 4/1992 | Yim et al. | 365/218 |
| 5,214,605 | 5/1993 | Lim et al. | 365/218 |
| 5,299,162 | 3/1994 | Kim et al. | 365/201 |
| 5,299,166 | 3/1994 | Suh et al. | 365/218 |
| 5,414,664 | 5/1995 | Lin et al. | 365/218 |
| 5,473,563 | 12/1995 | Suh et al. | 365/189.05 X |
| 5,511,022 | 4/1996 | Yim et al. | 365/185.17 |
| 5,544,116 | 8/1996 | Chao et al. | 365/210 |
| 5,546,341 | 8/1996 | Suh et al. | 365/185.33 |

OTHER PUBLICATIONS

B. Prince et al., *Semiconductor Memories, A Handbook of Design, Manufacture, and Application*. Second Edition, John Wiley & Sons Ltd., pp. 603–604 (1991).

Ashok K. Sharma, *Semiconductor Memories Technology, Testing, And Relialbility*, IEEE Press Marketing. Institute of Electrical and Electronics Engineers, Inc., 1997, pp. 122–139.

Kynett et al., *An In–System Reprogrammable 32KX8 CMOS Flash Memory*, IEEE Journal of Solid–State Circuits, vol. 23, No. 5, Oct. 1988, pp. 1157–1163.

*Primary Examiner*—Joseph A. Popek
*Attorney, Agent, or Firm*—Myers Bigel Sibley & Sajovec

[57] ABSTRACT

Integrated circuit memory devices with latch-free page buffers therein include a page buffer for electrically coupling a bit line from an array of memory cells to a buffer output. The page buffers generate a first logic state at an output thereof when the bit line is at a first logic potential and a high-impedance logic state when the bit line is at a second logic potential, during a memory read operation. An output buffer is also provided for converting the high-impedance state and the first logic state generated by the page buffer to respective opposite logic states (e.g. logic 1 and logic 0). The bit line data is used to directly trigger the appropriate state of the page buffer output by coupling a gate of an insulated-gate isolation transistor to the bit line data and then reading the source of the isolation transistor as the page buffer output.

12 Claims, 4 Drawing Sheets

INTEGRATED CIRCUIT MEMORY DEVICES WITH LATCH-FREE PAGE BUFFERS THEREIN FOR PREVENTING READ FAILURES

FIELD OF THE INVENTION

The present invention relates to integrated circuit memory devices, and more particularly to integrated circuit memory devices having page buffers therein.

BACKGROUND OF THE INVENTION

Semiconductor memory devices for storing data can typically be categorized as either volatile memory devices or nonvolatile memory devices. Volatile memory devices lose their stored data when their power supplies are interrupted, however nonvolatile memory devices retain their stored data even when their power supplies are interrupted. Thus, nonvolatile memory devices are widely used in applications where the possibility of power supply interruption is present.

Conventional nonvolatile memory devices include a type of electrically erasable programmable read only memory (EEPROM) device typically referred to as a flash EEPROM device. Flash EEPROM devices typically include a semiconductor substrate of first conductivity type (e.g., P-type), spaced source and drain regions of second conductivity type (e.g., N-type) in the substrate, a channel region at a face of the substrate, between the spaced source and drain regions, a floating gate for storing charge carriers when the device is programmed and a control gate which overlies the floating gate, opposite the channel region. Operation of a flash EEPROM device is typically divided into three modes including programming, erasing and reading.

Programming of a flash EEPROM device is typically achieved by biasing the drain region to a first positive bias, relative to the source region, and biasing the control gate to a second positive bias which is greater than the first positive bias. In the absence of any stored charge on the floating gate, these biases cause the formation of an inversion-layer channel of electrons at the face of the substrate, between the source and drain regions. As will be understood by those skilled in the art, the drain-to-source voltage accelerates these electrons through the channel to the drain region where they acquire sufficiently large kinetic energy and are typically referred to as "hot" electrons. The larger positive bias on the control gate also establishes an electrical field in a tunneling oxide layer which separates the floating gate from the channel region. This electric field attracts the hot electrons and accelerates them toward the floating gate, which is disposed between the control gate and the channel region, by a process known as tunneling. The floating gate then accumulates and traps the accumulated charge. Fortunately, the process of charging the floating gate is self-limiting. The negative charge that accumulates on the floating gate reduces the strength of the electric field in the tunneling oxide layer to the point where it is no longer capable of accelerating "hot" electrons from the drain side of the channel region.

As will be understood by those skilled in the art, the accumulation of a large quantity of trapped charge (electrons) on the floating gate will cause the effective threshold voltage ($V_{th}$) of the field effect transistor comprising the source region, drain region, channel region and control gate to increase. If this increase is sufficiently large, the field effect transistor will remain in a nonconductive "off" state when a predetermined "read" voltage is applied to the control gate during a read operation (i.e., $V_{th} > V_{read}$).

In this state, known as the programmed state, the EEPROM device may be said to be storing a logic 0. Once programmed, the EEPROM device retains its higher threshold voltage even when its power supply is interrupted or turned off for long periods of time.

Erasing of the EEPROM device may also be achieved by removing the stored charge from the floating gate. The erasure process can be achieved, for example, by grounding the control gate and applying a positive bias to the substrate (e.g., 10–20 Volts). Accordingly, flash EEPROM devices typically require bulk erasure of large portions of an array of cells since the effects of applying a large substrate bias typically cannot be confined to a single EEPROM cell.

Reading of the EEPROM device is achieved by applying a predetermined read voltage ($V_{read}$) to the control gate, typically via a word line connecting a row (i.e., page) of identical EEPROM devices or "cells", and applying a positive bias to the drain region, typically via a bit line connecting a column of identical EEPROM cells. If the EEPROM device is programmed, it will not conduct drain current ($I_{ds}$) and the bit line will remain at the positive bias. However, if the EEPROM device has not been programmed (or has been erased), it will heavily conduct and pull the bit lie down to ground potential (GND). In this state, the EEPROM device may be said to be storing a logic 1. Thus, by monitoring the bit line current and voltage, the programmed state (i.e., 1 or 0) of the EEPROM device can be determined.

Conventional flash EEPROM integrated circuit memory devices may contain column-by-column arrays of NAND EEPROM cells having the general construction illustrated in cross-section and schematically by FIGS. 11.58 and 11.59 from a handbook by B. Prince et al. entitled *Semiconductor Memories*, John Wiley & Sons Ltd., pp. 603–604 (1991); and in an article by M. Momodomi et al. entitled *An Experimental 4-Mbit CMOS EEPROM with a NAND Structured Cell*, IEEE Journal of Solid State Circuits, Vol. 24, No. 5, p. 1238 October (1989).

Page read operations may be performed on these types of arrays of memory cells using conventional page read buffers such as the page read buffer of FIG. 1 which is controlled in accordance with the timing diagram illustrated by FIG. 2. As will be understood by those skilled in the art, a page read operation can be performed using the buffer of FIG. 1 by (i) initially discharging nodes BS00–BS031 and the outputs of the data latches (formed by the first and second inverters I1–I2) to ground potential by turning on a plurality of discharge transistors N1 with a pulse (DCB) applied to the DCB0 signal line; and (ii) turning on a plurality of buffer pass transistors N2 with a pulse (DCL) applied to the DCL signal line. The bit lines are then precharged by turning on a plurality of bit line pass transistors N0 (by switching the Vbias0 signal line from logic 0→1) and then pulling up the nodes BS00–BS031 to a logic 1 potential (e.g., VCC) by turning on a plurality of pull-up transistors P1 (by switching the Pbpre signal line from logic 1→0 (e.g., 2 Volts→GND)). Once the bit lines have been precharged, the pull-up transistors P1 are almost completely turned-off by switching the Pbpre signal line from 0→1 (e.g., GND→1.8 V) so that the potentials of the bit lines can be "read" once a page of memory cells has been addressed.

A read operation is then performed to determine the states of a page of selected memory cells by monitoring the potentials of the bit lines BL0–BL31 and then latching the states of the bit lines into a data latch (inverters I1 and I2) by a applying a pulse to the Plch signal line to turn on a plurality of N-type pull-down transistors N4. Thus, if a bit line remains at a logic 1 potential after the read operation, a corresponding N-type bit line sense transistor N3 will turn on and pull the latch input to ground during the Plch pulse period. However, if the bit line is pulled to a logic 0 potential after the read operation, the bit line sense transistor N3 will not turn on and the output of the latch will remain at the logic 0 potential previously obtained when the DCL signal line was initially pulsed. The outputs of the latches are then transmitted through driving inverters 13 and sequentially provided to a data output line SAout by sequentially addressing the outputs using a two-tier column select circuit containing N-type transistors N6 connected to address lines YA0–YA7 and YB0–YB3.

Unfortunately, as determined by the inventors herein and illustrated by the BSO(E) timing lines in FIG. 2, data failures may occur during the read operation if the Plch pulse is applied while the nodes BS00–BS031 (collectively illustrated as BS0) are at improper levels. Thus, notwithstanding the above described conventional page buffer circuit and read methodology, as illustrated by FIGS. 1–2, there continues to be a need for improved page buffer circuitry which is less susceptible to read errors.

SUMMARY OF THE INVENTION

It is therefore an object of the present invention to provide improved integrated circuit memory devices.

It is another object of the present invention to provide integrated circuit memory devices having reduced susceptibility to read failures.

It is still another object of the present invention to provide more highly integrated memory devices having page buffers with reduced lateral dimensions.

These and other objects, features and advantages of the present invention are provided by integrated circuit memory devices containing latch-free page buffers therein. In particular, latch-free page buffer means is provided for electrically coupling a bit line of an array of memory cells to a buffer output and generating a first logic state at the page buffer output when the bit line is at a first logic potential and a high-impedance logic state at the page buffer output when the bit line is at a second logic potential, during a memory read operation. In addition, output buffer means is also provided for converting the high-impedance state and the first logic state at the page buffer output to respective opposite logic states (e..g, logic 1 and logic 0). For example, the output buffer means preferably comprises means for converting the high-impedance state to the first logic state (e.g., logic 1) and converting the first logic state to a second logic state (e.g., logic 0).

According to a preferred embodiment of the present invention, the latch-free page buffer means comprises a plurality of latch-free page buffer cells which each contain a bit line pass transistor, electrically coupled to a bit line, and data isolation means for generating the first logic and high-impedance states at the page buffer output if an output of the bit line pass transistor is at the first and second logic potentials, respectively. The bit line pass transistor preferably comprises an N-type enhancement mode field effect transistor and the data isolation means preferably comprises a P-type enhancement mode field effect transistor. The P-type data isolation transistor preferably has an insulated input gate which is electrically coupled to the output of the bit line pass transistor so that electrical isolation is provided between the input gate and the output of the page buffer which constitutes the source of the P-type transistor. Accordingly, during a memory read operation, the bit line data can be used to efficiently trigger the appropriate state of the page buffer output, but without the need for a latch to hold the bit line data as required by the prior art.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 3:
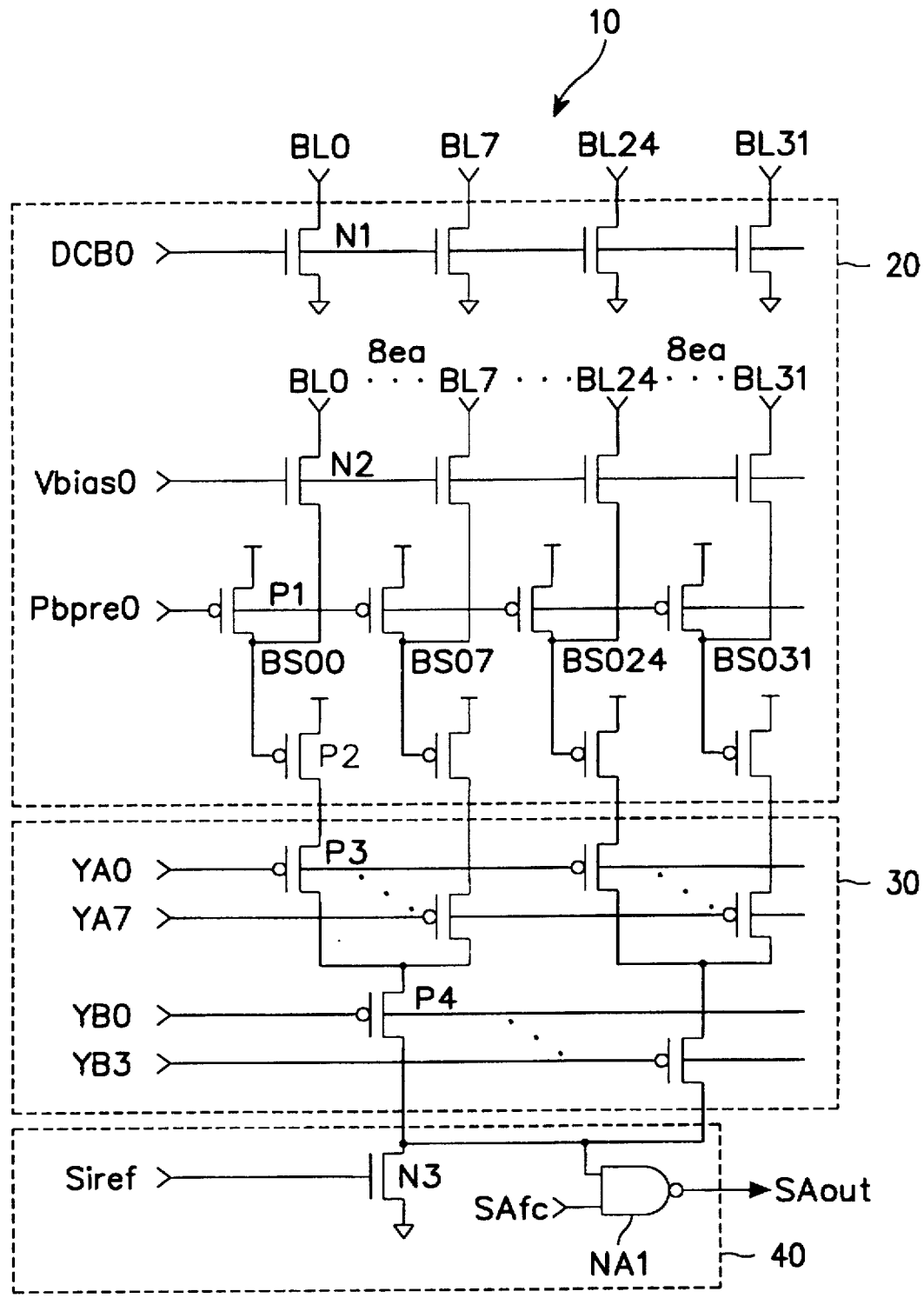
FIG. 3 illustrates an electrical schematic of a latch-free page buffer for an integrated circuit memory device, according to an embodiment of the present invention.

Referring now to FIG. 3, a preferred embodiment of an integrated circuit memory device containing a plurality of latch-free page buffer cells therein will now be described. In particular, the memory device 10 comprises an array of memory cells arranged as a plurality of pages of memory cells electrically coupled to a respective plurality of word lines and a plurality of columns of memory cells electrically coupled to a respective plurality of bit lines illustrated as BL0–BL31. Typical schematic and cross-sectional layouts of such arrays containing NAND EEPROM cells therein, for example, are more fully described in commonly assigned U.S. Pat. No. 5,546,341 to Suh et al. entitled Nonvolatile Semiconductor Memory; and in commonly assigned application Ser. No. 08/722,478, entitled Integrated Circuit Memory Devices Having Interleaved Read Capability and Methods of Operating Same, filed Sep. 27, 1996 (Attorney Docket No. 5649-121), the disclosures of which are hereby incorporated herein by reference. The memory device 10 contains a preferred latch-free page buffer means 20 for electrically coupling each of the bit lines (shown as BL0–BL31) to a respective page buffer output, illustrated as the source terminals of the P-type output transistors P2, and generating: (i) a first logic state (e.g., VCC) at a page buffer output when a respective bit line is at a first logic potential (e.g., ≈GND); and (ii) a high-impedance (i.e., open) logic state at the page buffer output when a respective bit line is at a second logic potential (e.g., ≈VCC), during a memory read operation.

A column selection circuit 30, responsive to first and second column selection address lines YA0–YA7 and YB0–YB3, is also provided for electrically connecting the plurality of page buffer outputs one-at-a-time to an input of an output buffer means 40. The column selection circuit 30 preferably comprises two-tiers of P-type selection transistors P3 and P4 and the output buffer means 40 preferably comprises an N-type field effect transistor N3 and a dual-input NAND gate NA1, electrically connected as illustrated. As described more fully hereinbelow with respect to FIG. 4, the output buffer means 40 preferably performs the function of converting the first and high-impedance logic states of an addressed page buffer output to respective opposite logic states at an output thereof illustrated as the SAout signal line.

Figure 4:
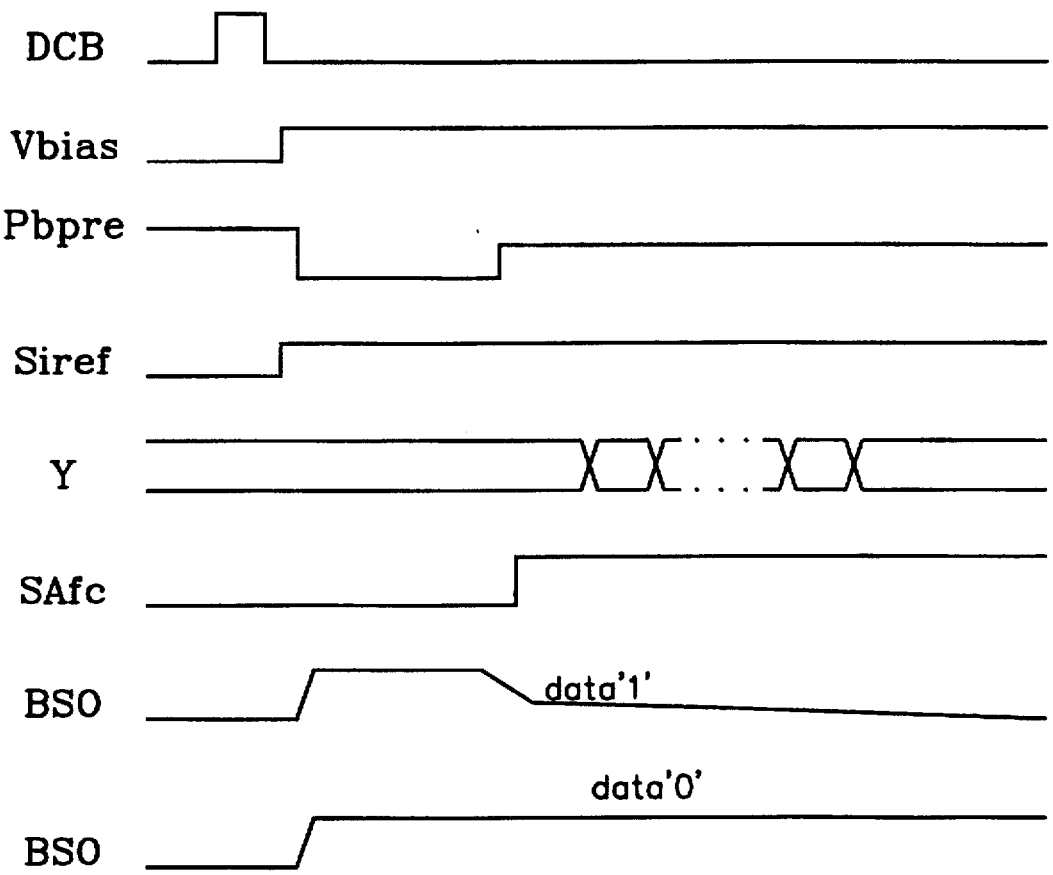
FIG. 4 is a diagram illustrating the timing of signals for performing a page read operation using the page buffer of FIG. 3.

Referring now to FIG. 4, a method of reading the integrated circuit memory device of FIG. 3 will now be described. In particular, FIG. 4 is a diagram illustrating the timing of signals for reading the states of a page of memory cells coupled to respective bit lines BL0–BL31 and generating a sequential string of binary data representing those states at an output SAout which may be coupled to an I/O data pad (not shown). During a read operation, the bit lines BL0–BL31 are initially pulled to a logic 0 potential (e.g., GND) by applying a bit line discharge pulse DCB to a discharge signal line DCB0 to thereby turn-on a plurality of N-type discharge transistors N1 which are electrically connected in series between the bit lines and ground (GND). The bit lines BL0–BL31 are then precharged to a logic 1 potential (e.g., ≈VCC) by turning on a plurality of N-type bit line pass transistors N2 and pulling the sources (at nodes BS00–BS031) of a plurality of P-type bit line precharge transistors P1 to VCC, the power supply potential. These steps are preferably performed by switching the pass signal line Vbias0 from logic 0→1 and switching the precharge signal line Pbpre from logic 1→0 (e.g., from 2 Volts to GND). Once the bit lines BL0–BL31 have been fully precharged, the precharge signal line Pbpre is switched to a potential of about 1.8 Volts to almost entirely turn-off the P-type bit line precharge transistors P1. A page of memory cells is then addressed and the data therein is downloaded to the page buffer means 20. As will be understood by those skilled in the art, if a selected memory cell in an addressed page has been programmed to store a "data 0", the respective bit line will remain at the precharged logic 1 potential as illustrated by signal BS0 in FIG. 4. But, if a selected memory cell in the addressed page has not been programmed (which represents a "data 1"), the respective bit line will be pulled to a logic 0 potential (i.e., GND).

Figure 1:
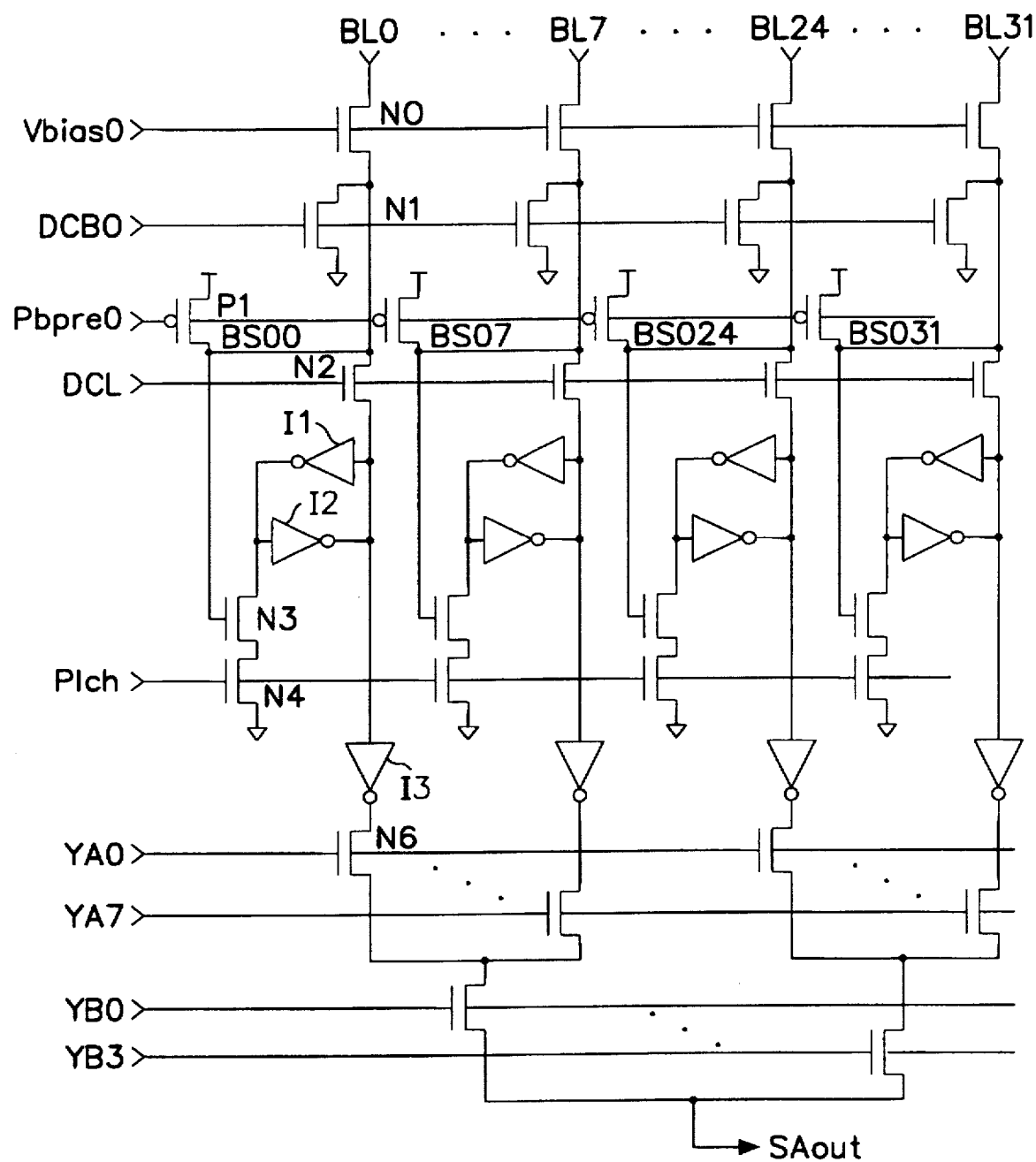
FIG. 1 illustrates an electrical schematic of a page buffer for an integrated circuit memory device, according to the prior art.
Figure 2:
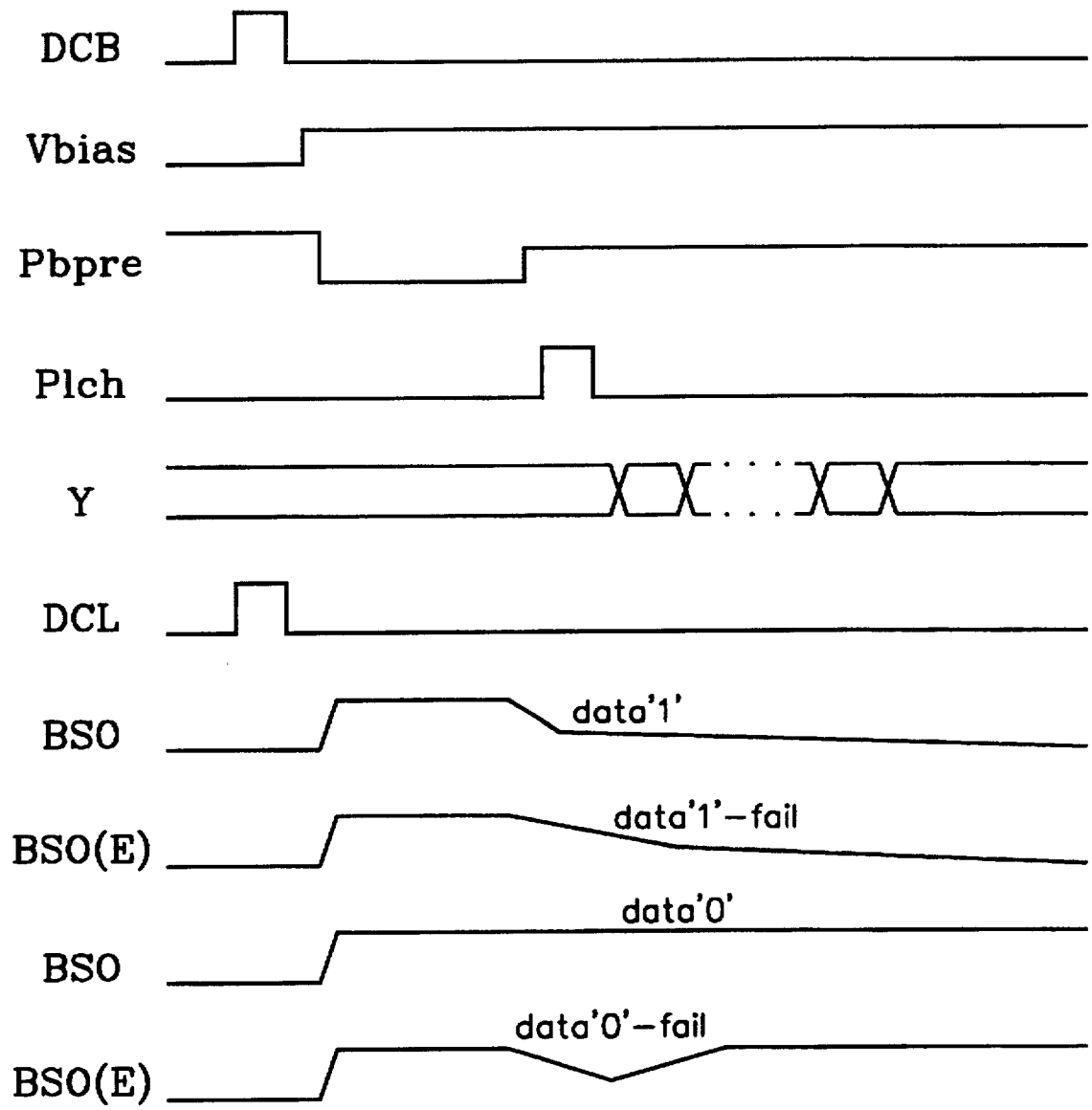
FIG. 2 is a diagram illustrating the timing of signals for performing a page read operation using the page buffer of FIG. 1.

However, rather than using a latch comprising, for example, a pair of antiparallel connected inverters as illustrated by FIG. 1, high input impedance data isolation transistors P2 are provided for converting the logic 1 and logic 0 states of the bit lines (and nodes BS00–BS031) to respective high-impedance (i.e., open) and logic 1 states at the outputs/sources of the data isolation transistors P2. The two tiers of address signal lines YA0–YA7 and YB0–YB3 (collectively illustrated as signal Y) can then be used to select each of the data isolation transistors P2 in sequence. The data at the output of the column selection circuit 30 is then converted to a logic 0 or a logic 1 signal (at the SAout signal line) depending on the state of the particular data isolation transistor P2 being addressed. In particular, if a data isolation transistor P2 is turned-on by a logic 0 gate bias, the output/source thereof will be pulled to the potential of the power supply (e.g., logic 1=VCC). But, if a logic 1 gate bias is applied, the data isolation transistor P2 will remain in an off state and therefore the output/source will remain in a high-impedance state. The state of the output of an addressed page buffer cell is then converted and provided to the SAout signal line by switching the Siref signal line from a logic 0 potential to a logic 1 potential (e.g., 1.7 Volts) to turn on the N-type pull-down transistor N3. The state of the drain of the pull-down transistor N3 is then inverted by switching the SAfc signal line from 0→1 so that the state of SAout is the boolean opposite of the drain. Accordingly, the present invention eliminates the need for a data latch in the page buffer circuitry, by utilizing the source of an insulated-gate field effect transistor (IGFET) as the output of the page buffer. This eliminates the likelihood of inadvertent latching of erroneous bit line data during a read operation and also reduces the area required to implement a page buffer in a semiconductor substrate.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:

an array of memory cells arranged as a plurality of pages of memory cells electrically coupled to a respective plurality of word lines and a plurality of columns of memory cells electrically coupled to a respective plurality of bit lines;

latch-free page buffer means, electrically coupled to at least one bit line, for generating at a buffer output thereof a first logic state when the at least one bit line is at a first logic potential and a high-impedance state when the at least one bit line is at a second logic potential; and output buffer means, electrically coupled to the buffer output, for converting the first logic state and the high-impedance state to respective opposite logic states.

2. The integrated circuit memory device of claim 1, wherein said output buffer means comprises means for converting the high-impedance state and the first logic state to the first logic state and a second logic state, respectively.

3. The integrated circuit memory device of claim 2, wherein the first logic state is a logic 1 state and the second logic state is a logic 0 state.

4. The integrated circuit memory device of claim 1, wherein said latch-free page buffer means comprises a bit line pass transistor electrically coupled to the at least one bit line; and data isolation means for generating the first logic and high-impedance states at the buffer output if an output of said bit line pass transistor is at the first and second logic potentials, respectively.

5. The integrated circuit memory device of claim 4, wherein said bit line pass transistor is a first-type field effect transistor and wherein said data isolation means comprises a second-type insulated-gate field effect transistor.

6. The integrated circuit memory device of claim 5, wherein the first-type field effect transistor is an N-type enhancement-mode field effect transistor and wherein the second-type field effect transistor is a P-type enhancement-mode field effect transistor.

7. The integrated circuit memory device of claim 6, wherein a gate of the P-type enhancement-mode field effect transistor is electrically connected to the source of the N-type enhancement mode field effect transistor.

8. The integrated circuit memory device of claim 7, further comprising a bit line precharge transistor electrically connected in series between a power supply line and the source of the N-type enhancement-mode field effect transistor.

9. An integrated circuit memory device, comprising:

an array of memory cells arranged as a plurality of pages of memory cells electrically coupled to a respective plurality of word lines and a plurality of columns of memory cells electrically coupled to a respective plurality of bit lines;

a plurality of latch-free page buffer cells electrically coupled to the plurality of bit lines, each of said latch-free page buffer cells containing an isolation transistor therein for generating during a read operation a high-impedance state at an output thereof when a respective bit line is at a predetermined logic potential; and output buffer means, electrically coupled to the outputs of the cells via a column selection circuit, for converting the high-impedance states to binary logic states.

10. The integrated circuit memory device of claim 9, wherein at least one of said latch-free page buffer cells comprises a bit line pass transistor electrically coupled to one of the plurality of bit lines; and a data isolation transistor for disposing the output of the at least one cell in the high impedance state if an output of the bit line pass transistor is at a logic 1 potential.

11. The integrated circuit memory device of claim 10, wherein the bit line pass transistor is an N-type enhancement-mode field effect transistor and wherein the data isolation transistor is a P-type insulated-gate field effect transistor.

12. The integrated circuit memory device of claim 11, wherein a gate of the P-type transistor is electrically connected to a source of the N-type transistor.

* * * * *